(12) United States Patent
Chang

(10) Patent No.: US 7,532,033 B2
(45) Date of Patent: May 12, 2009

(54) SOURCE DRIVER AND LEVEL SHIFTING APPARATUS THEREOF

(75) Inventor: Yu-Jui Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/622,721

(22) Filed: Jan. 12, 2007

(65) Prior Publication Data

US 2008/0169858 A1 Jul. 17, 2008

(51) Int. Cl.
*H03K 19/094* (2006.01)

(52) U.S. Cl. .......................... 326/68; 326/81; 327/333; 327/536

(58) Field of Classification Search .................... 326/68, 326/62, 63, 80–83, 86, 87; 327/333, 535–537; 363/59, 60

See application file for complete search history.

(56) References Cited

U.S. PATENT DOCUMENTS

| | | | |
|---|---|---|---|
| 6,956,771 B2 * | 10/2005 | Sarig et al. | 365/185.18 |
| 2001/0020864 A1 * | 9/2001 | Myono | 327/536 |
| 2003/0025549 A1 * | 2/2003 | Ito et al. | 327/536 |
| 2004/0164766 A1 * | 8/2004 | Yu | 326/68 |
| 2004/0232944 A1 * | 11/2004 | Bu et al. | 326/68 |
| 2005/0184780 A1 * | 8/2005 | Chun | 327/175 |
| 2007/0096795 A1 * | 5/2007 | Georgescu et al. | 327/536 |
| 2007/0139092 A1 * | 6/2007 | Goncalves et al. | 327/333 |

* cited by examiner

*Primary Examiner*—James H. Cho
*Assistant Examiner*—Jany Tran

(57) ABSTRACT

The present invention discloses a source driver and a level shifting apparatus thereof. The level shifting apparatus is used for shifting a level of a data signal. The level shifting apparatus comprises a first charge pump and a level shifter. The first charge pump supplies a first pumped voltage based on the data signal. The level shifter generates a level-shifted data signal based on the first pumped voltage.

16 Claims, 6 Drawing Sheets

SOURCE DRIVER AND LEVEL SHIFTING APPARATUS THEREOF

FIELD OF THE INVENTION

The present invention relates to a level shifting apparatus for use in a source driver, and more particularly, to a level shifting apparatus having a charge pump for pumping input signals of the level shifting apparatus.

BACKGROUND OF THE INVENTION

FIG. 1 illustrates a diagram of a source driver used in a LCD (Liquid Crystal Display) device. The source driver 100 shown in FIG. 1 comprises a shift register 102, a latch buffer 104, a level shifter 106 and a digital-to-analog converter (DAC) 108. The latch buffer 104 stores and outputs digital data signals by the control of the shift register 102. The level shifter 106 shifts voltage levels of the digital data signals to predetermined voltage levels. The digital-to-analog converter (DAC) 108 generates a driving voltage Vd to drive the LCD according to the outputted signals from the level shifter 106.

FIG. 2 illustrates a diagram of a conventional level shifter. As shown in FIG. 2, the level shifter 106 comprises a first transistor 202, a second transistor 204, a third transistor 206, a fourth transistor 208, and a fifth transistor 210. The first transistor 202 and the second transistor 204 are N type transistors while the third transistor 206, the fourth transistor 208 and the fifth transistor 210 are P type transistors. The first transistor 202 has a first source/drain connected to a reference voltage source VSSA, a second source/drain connected to an inverted output node OUTB, and a gate connected to an input node IN1 for receiving the digital data signal. The second transistor 204 has a first source/drain connected to the reference voltage source VSSA, a second source/drain connected to an output node OUT, and a gate connected to an inverted input node IN2 for receiving a signal corresponding to the opposite logic state of the digital data signal.

The third transistor 206 has a first source/drain connected to the inverted output node OUTB, a gate connected to the output node OUT, and a second source/drain. The fourth transistor 208 has a first source/drain connected to the output node OUT, a gate connected to the inverted output node OUTB, and a second source/drain connected to the second source/drain of the third transistor 206. The fifth transistor 210 has a first source/drain connected to the second source/drains of the third transistor 206 and the fourth transistor 208, a second source/drain connected to a high voltage source VDDA, and a gate connected to a reference voltage source VSSA.

When the input voltage inputted to the level shifter 106 via the input node IN1 decreases, the turning on and off of the first transistor 202 and the second transistor 204 of the level shifter is slow resulting in the late response of the third transistor 206 and the fourth transistor 208. Therefore, a DC current path along the first transistor 202 and the third transistor 206 occurs and thus increases the power consumption.

SUMMARY OF THE INVENTION

Therefore, objectives of the present invention are to provide a level shifting apparatus/source driver having less transition time and less power consumption.

According to the aforementioned objectives, the present invention provides a level shifting apparatus for shifting a level of a data signal. The level shifting apparatus comprises a first charge pump and a level shifter. The first charge pump supplies a first pumped voltage based on the data signal. The level shifter generates a level-shifted data signal based on the first pumped voltage.

According to another objective, the present invention provides a source driver comprising a latch buffer and a level shifting apparatus. The latch buffer is used for receiving a data stream and outputting a data signal. The level shifting apparatus comprises a first charge pump and a level shifter. The first charge pump supplies a first pumped voltage based on the data signal. The level shifter generates a level-shifted data signal based on the first pumped voltage.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIGS. 3 through 6.

Figure 1:
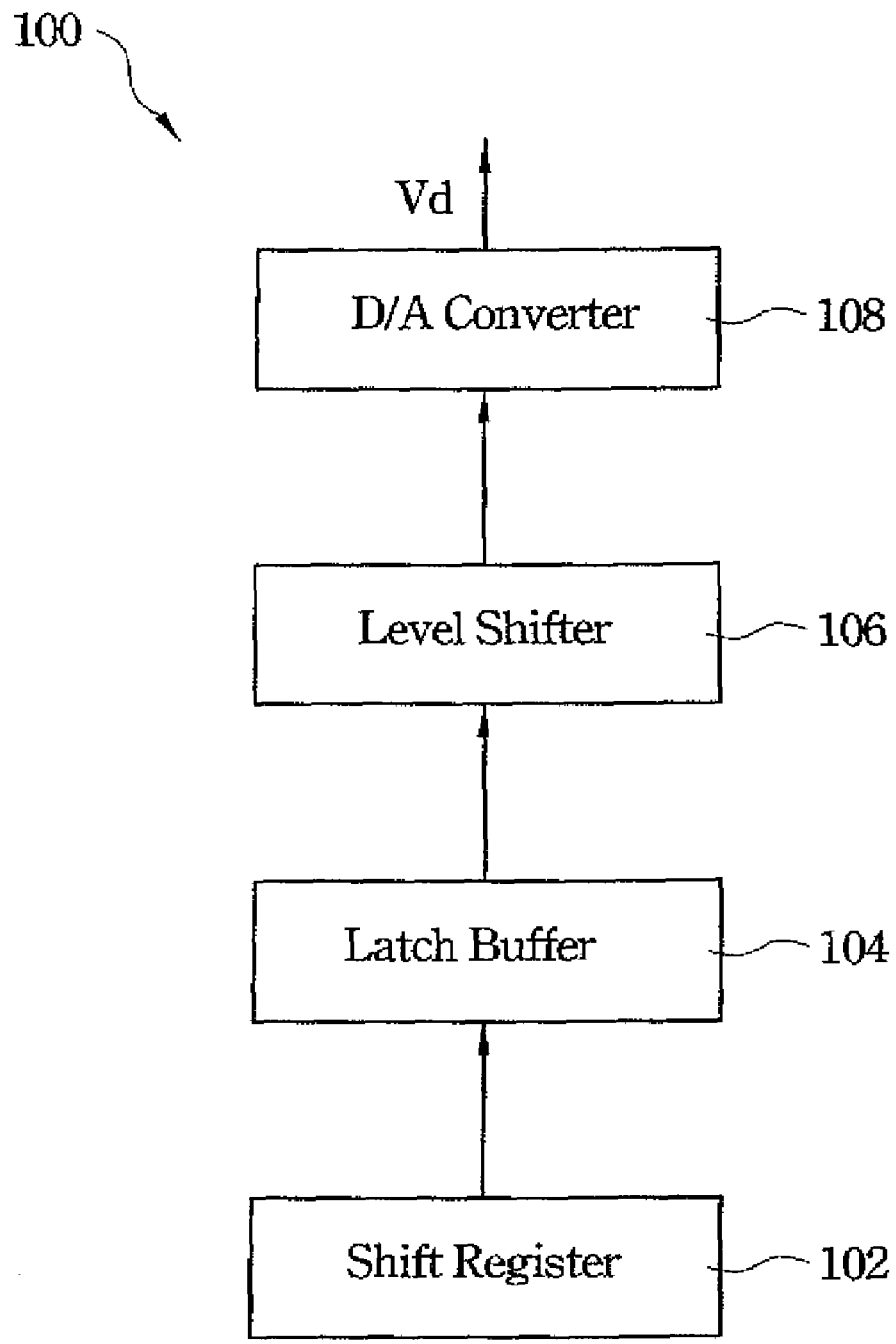
FIG. 1 illustrates a diagram of a source driver used in a LCD device.
Figure 2:
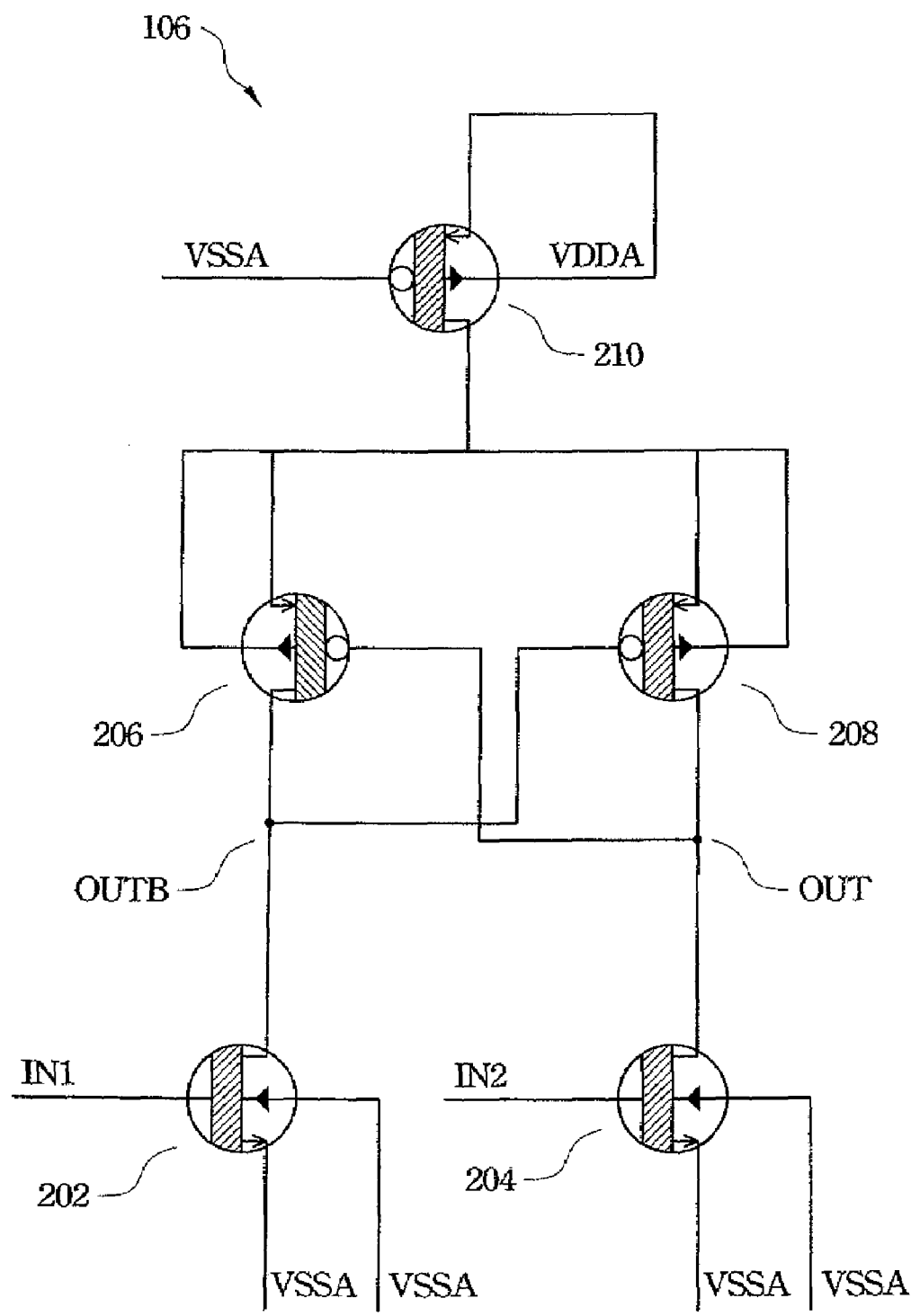
FIG. 2 illustrates a diagram of a conventional level shifter.
Figure 3:
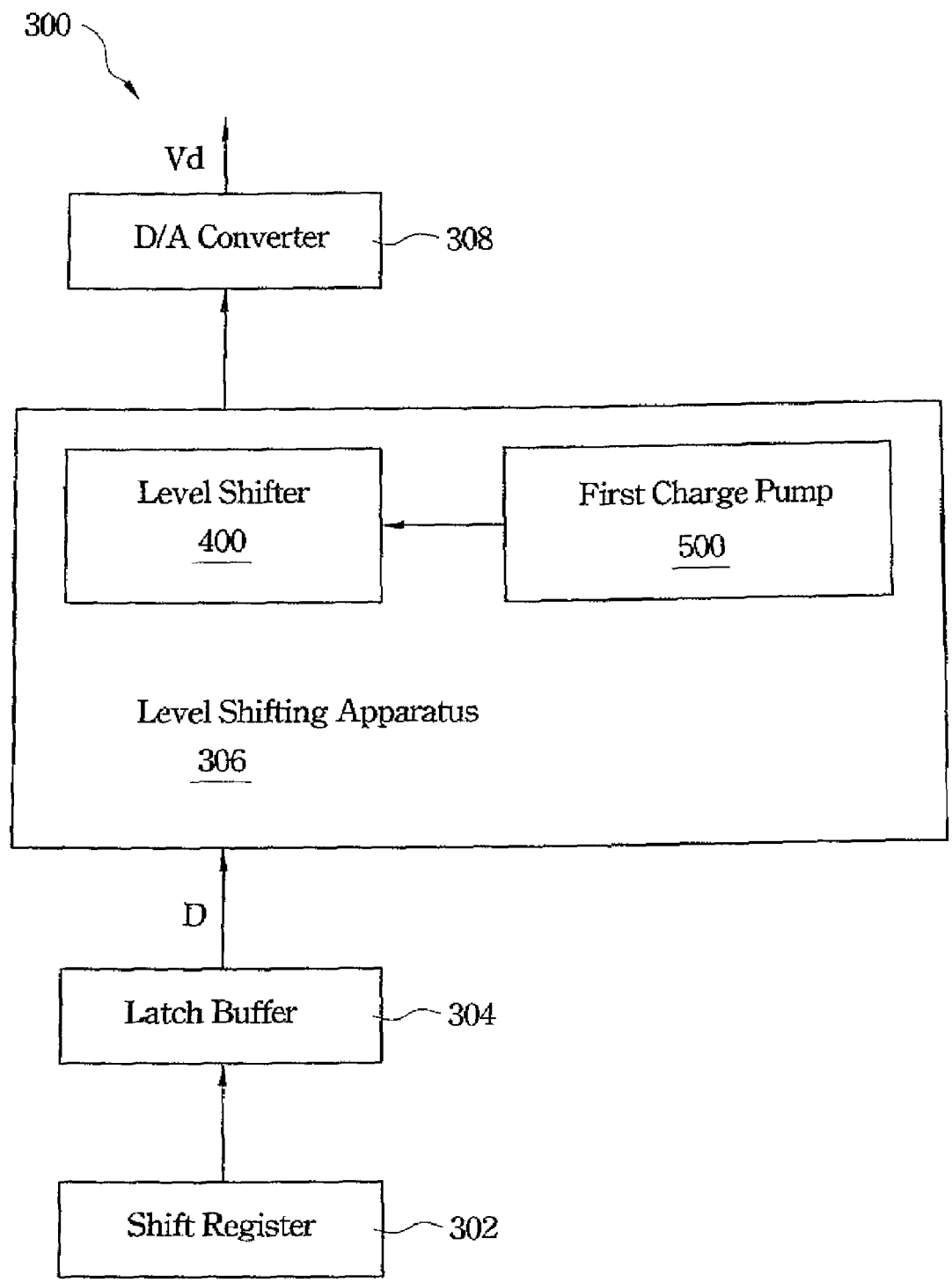
FIG. 3 illustrates a diagram of a source driver used in a LCD device according to the preferred embodiment of the present invention.

Reference is made to FIG. 3 illustrating a diagram of a source driver used in a LCD device according to the preferred embodiment of the present invention. The source driver 300 shown in FIG. 3 comprises a shift register 302, a latch buffer 304, a level shifting apparatus 306 and a digital-to-analog converter (DAC) 308. The latch buffer 304 receives a data stream and stores and outputs a data signal D according to the shift register 302. The level shifting apparatus 306 shifts the level of the data signal D. The digital-to-analog converter (DAC) 308 receives the level-shifted data signal for outputting a driving voltage Vd to drive the LCD.

The level shifting apparatus 306 comprises a level shifter 400 and a first charge pump 500. The first charge pump 500 supplies a first pumped voltage Vp1 based on the data signal. The level shifter 400 generates the level-shifted data signal based on the first pumped voltage Vp1. The detail of the level shifting apparatus will be described as follows.

Figure 4:
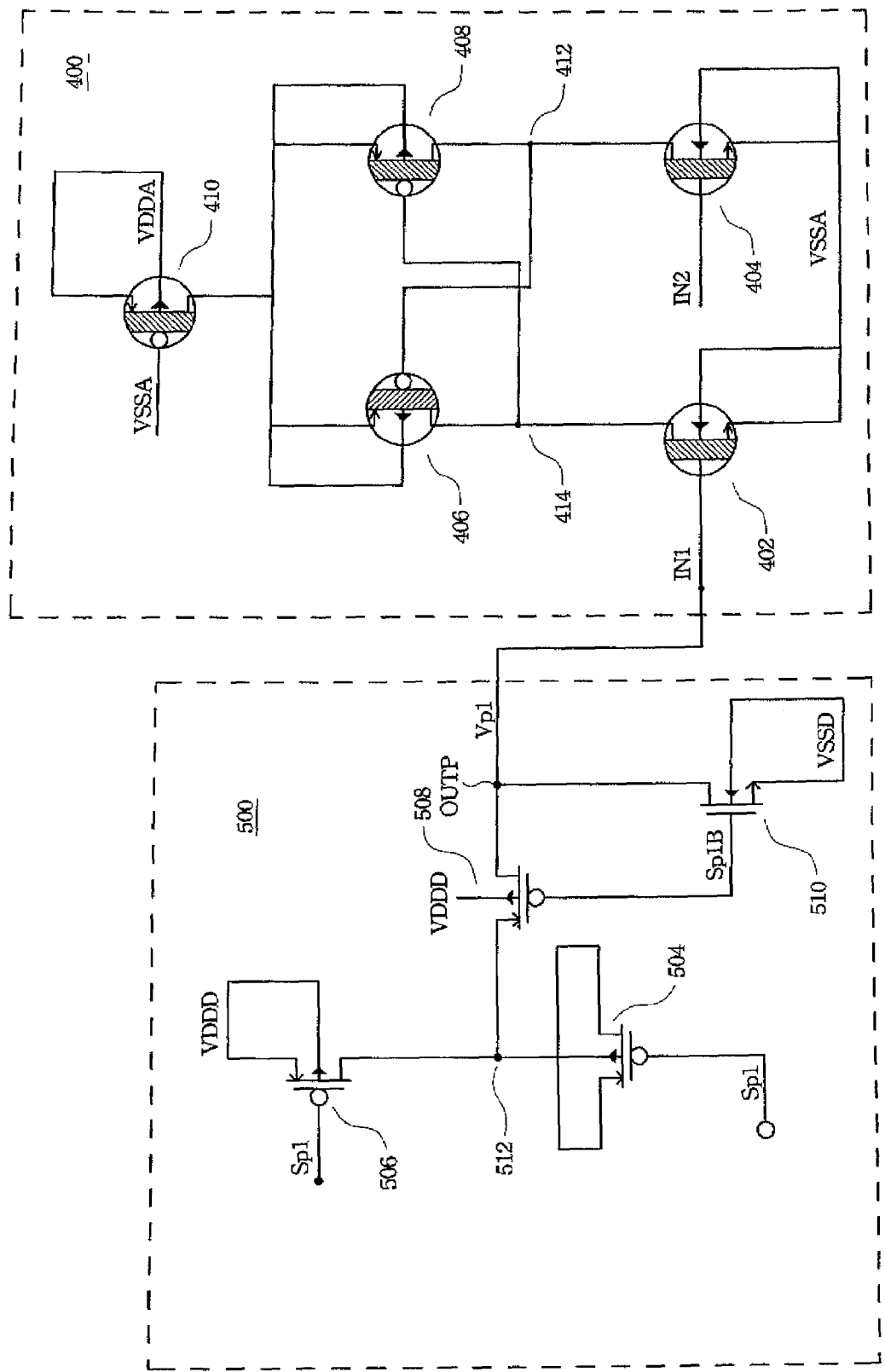
FIG. 4 illustrates a diagram of the level shifting apparatus according to the preferred embodiment of the present invention.

FIG. 4 illustrates a diagram of the level shifting apparatus according to the preferred embodiment of the present invention. As shown in FIG. 4, the level shifting apparatus 306 comprises the level shifter 400 and the first charge pump 500. The level shifter 400 comprises a first transistor 402, a second transistor 404, a third transistor 406, a fourth transistor 408, and a fifth transistor 410. The first transistor 402 and the second transistor 404 are N type transistors while the third transistor 406, the fourth transistor 408 and the fifth transistor 410 are P type transistors. The first transistor 402 has a first source/drain connected to a reference voltage source VSSA, a second source/drain connected to an inverted output node 414, and a gate as a first input node IN1. The second transistor 404 has a first source/drain connected to the reference voltage source VSSA, a second source/drain connected to an output node 412, and a gate as a second input node IN2. The first input node IN1 receives the first pumped voltage Vp1 and the second input node IN2 receives an inverse of the data signal.

The third transistor 406 has a first source/drain connected to the inverted output node 414, a gate connected to the output node 412, and a second source/drain. The fourth transistor 408 has a first source/drain connected to the output node 412, a gate connected to the inverted output node 414, and a second source/drain connected to the second source/drain of the third transistor 406. The fifth transistor 410 has a first source/drain connected to the second source/drains of the third transistor 406 and the fourth transistor 408, a second source/drain connected to a high voltage source VDDA, and a gate connected to a reference voltage source VSSA.

As shown in FIG. 4, the first charge pump 500 receives a first pumping signal Sp1 for outputting a first pumped voltage Vp1 at the pump output node OUTP. The first pumping signal Sp1 may be the data signal from the latch buffer 304. The first charge pump 500 comprises a sixth transistor 504, a seventh transistor 506, an eighth transistor 508, and a ninth transistor 510. The sixth transistor 504, functioning as a capacitor, has a first node 512 and a gate for receiving the first pumping signal Sp1. The seventh transistor 506, functioning as a switch and controlled by the first pumping signal Sp1, selectively connects a low voltage source VDDD and the first node 512 of the sixth transistor 504. The eighth transistor 508, functioning as a switch and controlled by the inversed first pumping signal Sp1B, selectively connects the first node 512 of the sixth transistor 504 and the pump output node OUTP. The ninth transistor 510, functioning as a switch, is connected between the pump output node OUTP and the reference voltage source VSSD.

When the first pumping signal Sp1 is at a low level, the eighth transistor 508 is turned off, and the seventh transistor 506 and the ninth transistor 510 are turned on. The pump output node OUTP of the first charge pump 500 is thus connected to the reference voltage source VSSD. When the first pumping signal Sp1 is at a high level, the eighth transistor 508 is turned on, and the seventh transistor 506 and the ninth transistor 510 are turned off. The first pumped voltage Vp1 is thus generated at the pump output node OUTP and therefore the voltage level thereof is larger than the low voltage source VDDD.

When the first pumped voltage Vp1 is inputted to the level shifter 400 via the input node IN1 as logic high, the first transistor 402 is turned on, and the fourth transistor 408 is also then turned on. Then, the level-shifted data signal is outputted from the output nodes OUT and OUTB. On the contrary, when the second input node IN2 receives a signal whose state is logic high, the second transistor 404 is turned on, and the third transistor 406 is also then turned on. Then, the level-shifted data signal is outputted from the output nodes OUT and OUTB.

Figure 5:
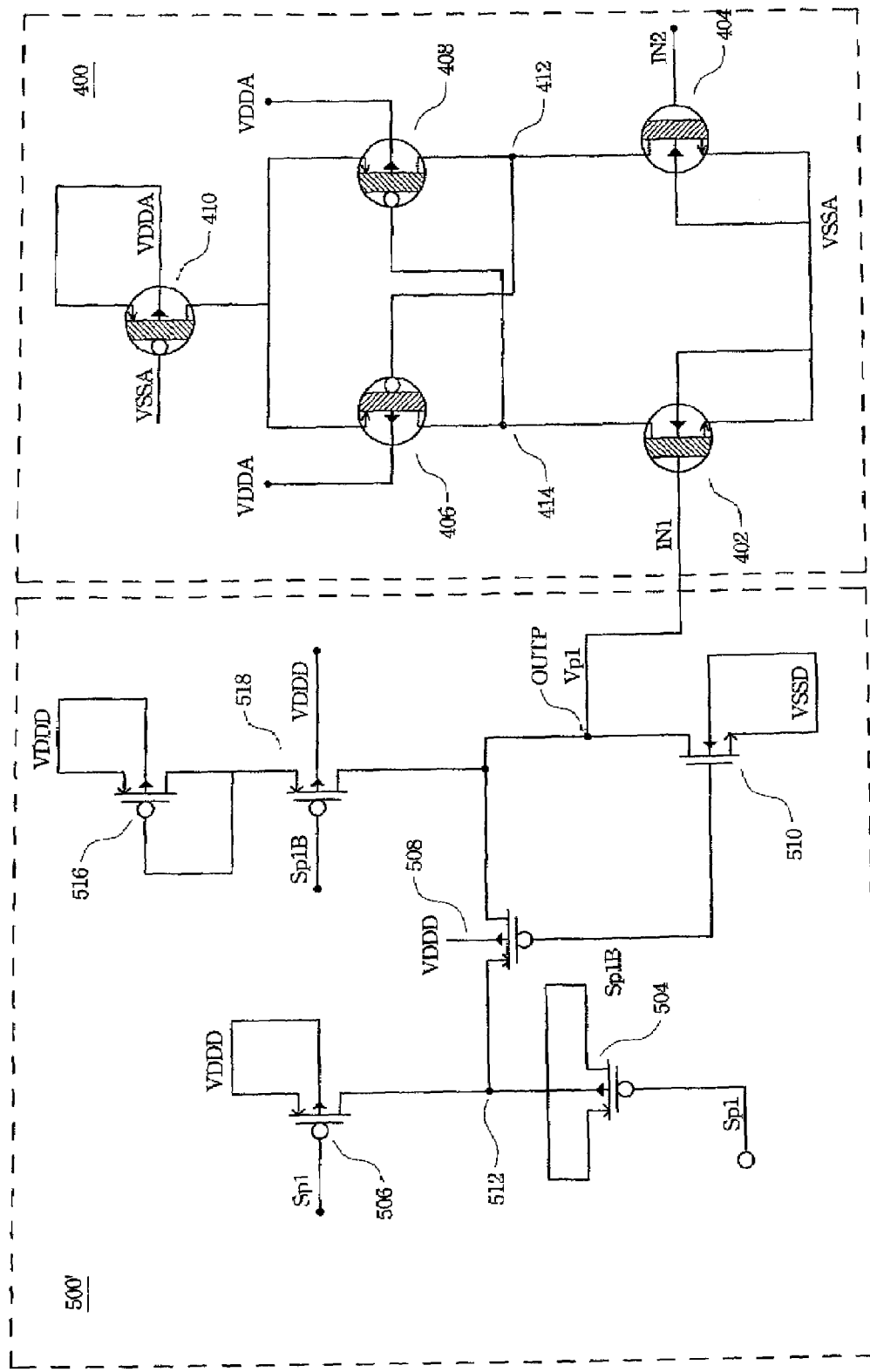
FIG. 5 illustrates another diagram of the level shifting apparatus according to the preferred embodiment of the present invention.

FIG. 5 illustrates another example of the level shifting apparatus according to the preferred embodiment of the present invention. As shown in FIG. 5, the first charge pump 500' compared to the first charge pump 500 in FIG. 4 further comprises a tenth transistor 516 and an eleventh transistor 518. The tenth transistor 516 has a first source/drain connected to the low voltage source VDDD, and functions as a diode. The eleventh transistor 518 connects to the gate of the tenth transistor 516, and the eleventh transistor 518, functioning as a switch and controlled by the inversed first pumping signal Sp1B, selectively connects the tenth transistor 516 and the pump output node OUTP of the first charge pump 500'.

When the first pumping signal is at a low level, the eighth transistor 508 is turned off, the seventh transistor 506 and the ninth transistor 510 are turned on, and the eleventh transistor 518 is also turned off. The pump output node OUTP of the first charge pump 500' is connected to the reference voltage source VSSD. When the first pumping signal is at a high level, the eighth transistor 508 is turned on, the seventh transistor 506 and the ninth transistor 510 are turned off, and the eleventh transistor 518 is turned on. The first pumped voltage Vp1 is thus generated at the pump output node OUTP. Furthermore, a current flows from the low voltage source VDDD to the pump output node OUTP through the eleventh transistor 518 to supply a voltage to the pump output node OUTP. Therefore, if the first pumping signal being at a high level is kept for a long time, the voltage of the pump output node OUTP can still be at least kept to nearly the low voltage source VDDD.

Figure 6:
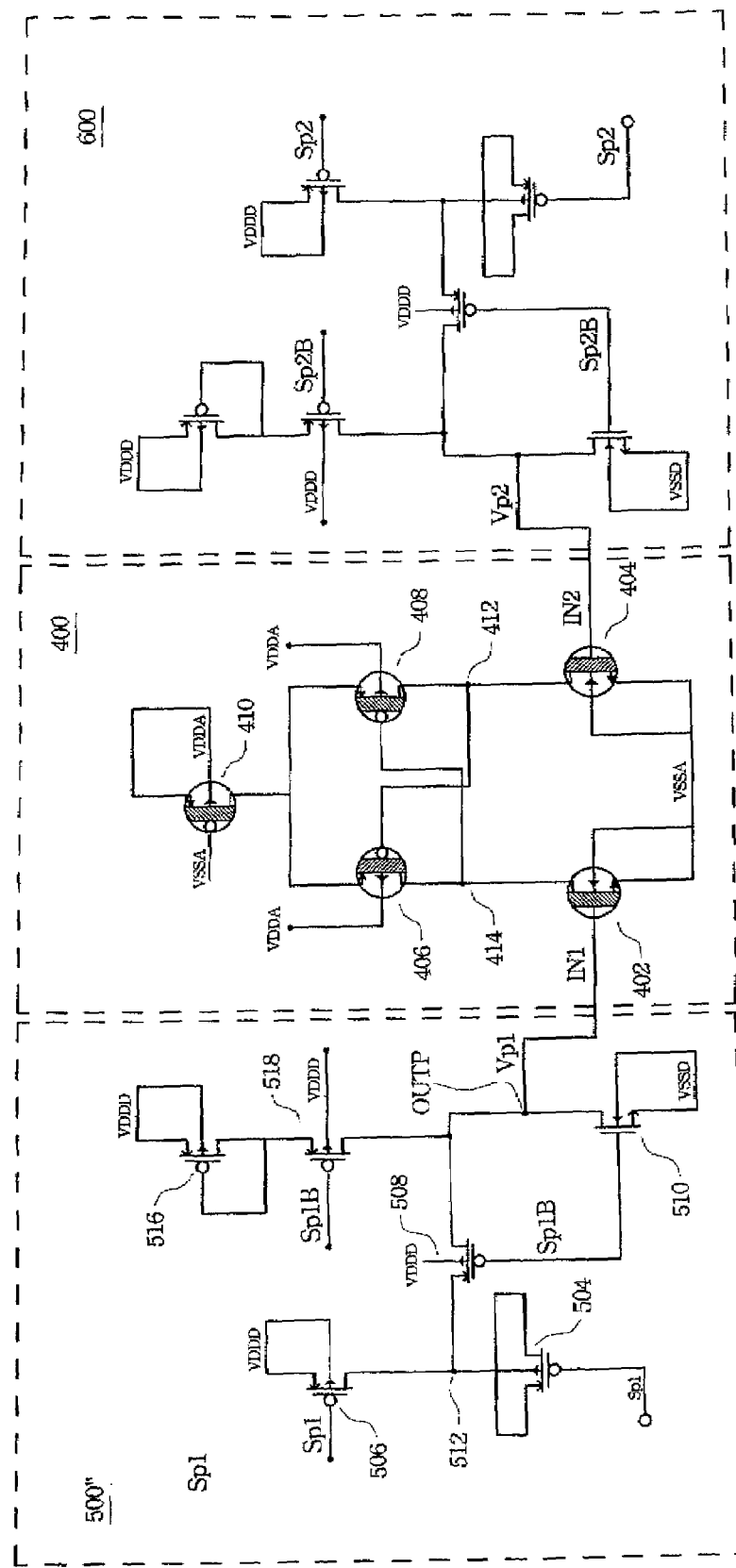
FIG. 6 illustrates still another diagram of the level shifting apparatus according to the preferred embodiment of the present invention.

FIG. 6 illustrates still another example of the level shifting apparatus according to the preferred embodiment of the present invention. As shown in FIG. 6, the level shifting apparatus in FIG. 6 compared to the level shifting apparatus in FIG. 5 and in FIG. 4 further comprises a second charge pump 600 that supplies a second pumped voltage Vp2 based on an inverse of the data signal, and the level shifter 400 generates the level-shifted data signal based on the first pumped voltage Vp1 and the second pumped voltage Vp2.

According to the aforementioned description, one advantage of the preferred embodiment is that the power consumption in the level shifting apparatus of the present invention is reduced.

According to the aforementioned description, another advantage of the preferred embodiment is that at least one charge pump pumps the input signal of the level shifting apparatus, so the operation voltage of the input signal can be reduced.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A level shifting apparatus for shifting a level of a data signal, comprising:
    a first charge pump, supplying a first pumped voltage based on the data signal, wherein the first charge pump comprises:
        a capacitor having a first node and a second node, wherein the second node is for receiving a first pumping signal;
        a first switch selectively connecting a low voltage source and the first node of the capacitor;
        a second switch selectively connecting the first node of the capacitor and a pump output node of the first charge pump for outputting the first pumped voltage; and
        a third switch selectively connecting the pump output node and a reference voltage source;
        a diode connecting to the low voltage source; and a fourth switch selectively connecting the low voltage source and the pump output node and controlled by the first pumping signal; and a level shifter, having an input node to receive the first pumped voltage for generating a level-shifted data signal based on the first pumped voltage.

2. The apparatus as claimed in claim 1, wherein the level shifter further has an input node that receives an inverse of the data signal, and the level shifter generates the level-shifted data signal based on the first pumped voltage and the inverse of the data signal.

3. The apparatus as claimed in claim 1, wherein the level shifter comprises:

a first transistor having a first source/drain connected to a reference voltage source, a second source/drain connected to an inverted output node, and a gate as a first input node;

a second transistor having a first source/drain connected to the reference voltage source, a second source/drain connected to an output node, and a gate as a second input node;

a third transistor having a first source/drain connected to the inverted output node, a gate connected to the output node, and a second source/drain;

a fourth transistor having a first source/drain connected to the output node, a gate connected to the inverted output node, and a second source/drain connected to the second source/drain of the third transistor; and a fifth transistor having a first source/drain connected to the second source/drains of the third transistor and the fourth transistor, a second source/drain connected to a high voltage source, and a gate.

4. The apparatus as claimed in claim 3, wherein the first transistor and the second transistor are N type transistors while the third transistor, the fourth transistor and the fifth transistor are P type transistors.

5. The apparatus as claimed in claim 3, wherein the first input node receives the first pumped voltage and the second input node receives an inverse of the data signal.

6. The apparatus as claimed in claim 1, further comprising:

a second charge pump that supplies a second pumped voltage based on an inverse of the data signal, and the level shifter generates the level-shifted data signal based on the first pumped voltage and the second pumped voltage.

7. The apparatus as claimed in claim 1, wherein the first pumping signal is in accordance with the data signal.

8. The apparatus as claimed in claim 1, wherein the second switch is turned off, and the first switch and the third switch are turned on when the first pumping signal is at a low level.

9. The apparatus as claimed in claim 1, wherein the second switch is turned on, and the first switch and the third switch are turned off when the first pumping signal is at a high level.

10. A source driver comprising:

a latch buffer for receiving a data stream and outputting a data signal; and a level shifting apparatus comprising:

a first charge pump, supplying a first pumped voltage based on the data signal, wherein the first charge pump comprises:

a capacitor having a first node and a second node, wherein the second node is for receiving a first pumping signal;

a first switch selectively connecting a low voltage source and the first node of the capacitor;

a second switch selectively connecting the first node of the capacitor and a pump output node of the first charge pump for outputting the first pumped voltage;

a third switch selectively connecting the pump output node of the first charge pump and a reference voltage source; and a fourth switch selectively connecting the low voltage source and the pump output node of the first charge pump and controlled by the first pumping signal; and a level shifter, for generating a level-shifted data signal based on the first pumped voltage.

11. The source driver as claimed in claim 10, wherein the level shifter has input nodes that receive the first pumped voltage and an inverse of the data signal, respectively.

12. The source driver as claimed in claim 10, further comprising:

a second charge pump that supplies a second pumped voltage based on an inverse of the data signal, and the level shifter generates the level-shifted data signal based on the first pumped voltage and the second pumped voltage.

13. The source driver as claimed in claim 10, wherein the first pumping signal is in accordance with the data signal.

14. The source driver as claimed in claim 10, wherein the second switch is turned off, and the first switch and the third switch are turned on when the first pumping signal is at a low level.

15. The source driver as claimed in claim 10, wherein the second switch is turned on, and the first switch and the third switch are turned off when the first pumping signal is at a high level.

16. A level shifting apparatus for shifting a level of a data signal, comprising:

a first charge pump, supplying a first pumped voltage based on the data signal, wherein the first charge pump comprises:

a capacitor having a first node and a second node, wherein the second node is for receiving a first pumping signal;

a first switch selectively connecting a low voltage source and the first node of the capacitor;

a second switch selectively connecting the first node of the capacitor and a pump output node of the first charge pump for outputting the first pumped voltage;

a third switch selectively connecting the pump output node of the first charge pump and a reference voltage source;

a diode connecting to the low voltage source; and a fourth switch selectively connecting the low voltage source and the pump output node of the first charge pump and controlled by the first pumping signal; and a level shifter, for generating a level-shifted data signal based on the first pumped voltage, wherein the level shifter has input nodes that receive the first pumped voltage and an inverse of the data signal, respectively.

* * * * *